United States Patent
Kakizoe et al.

(10) Patent No.: US 6,188,610 B1
(45) Date of Patent: Feb. 13, 2001

(54) ELECTRICALLY ERASABLE AND PROGRAMMABLE NONVOLATILE SEMICONDUCTOR MEMORY DEVICE HAVING DATA HOLDING FUNCTION AND DATA HOLDING METHOD

(75) Inventors: Kazuhiko Kakizoe, Fuchu; Toru Okawa, Yokohama, both of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/497,175

(22) Filed: Feb. 3, 2000

(30) Foreign Application Priority Data

Feb. 4, 1999 (JP) .................................................. 11-027210

(51) Int. Cl.[7] ...................................................... G11C 7/00
(52) U.S. Cl. ................................. 365/185.22; 365/189.07
(58) Field of Search ........................... 365/185.22, 189.07

(56) References Cited

U.S. PATENT DOCUMENTS

| 5,574,684 | 11/1996 | Tomoeda | 365/185.04 |
| 5,784,315 | * 7/1998 | Itoh | 365/185.22 |
| 5,784,318 | * 7/1998 | Anami | 365/185.22 |
| 5,805,510 | * 9/1998 | Miyakawa et al. | 365/185.11 |
| 5,930,168 | * 7/1999 | Roohparvar | 365/185.03 |

FOREIGN PATENT DOCUMENTS 9-91978    4/1997 (JP) .

* cited by examiner

Primary Examiner—Son T. Dinh
(74) Attorney, Agent, or Firm—Oblon, Spivak, McClelland, Maier & Neustadt, P.C.

(57) ABSTRACT

Data of a memory cell in a cell array is read out by a readout circuit by use of a word line potential which is the same as that at the program verify time. After the end of the readout operation, data of the same memory cell is read out by the readout circuit by use of a word line potential (refresh verify potential) which is lower than the word line potential at the program verify time and higher than the word line potential at the read time. Then, data read out by use of the word line potential which is the same as that at the program verify time is compared with data read out by use of the word line potential which is set at the refresh verify potential and whether or not the additional write operation for holding data is effected for the memory cell is determined according to the result of comparison.

22 Claims, 7 Drawing Sheets

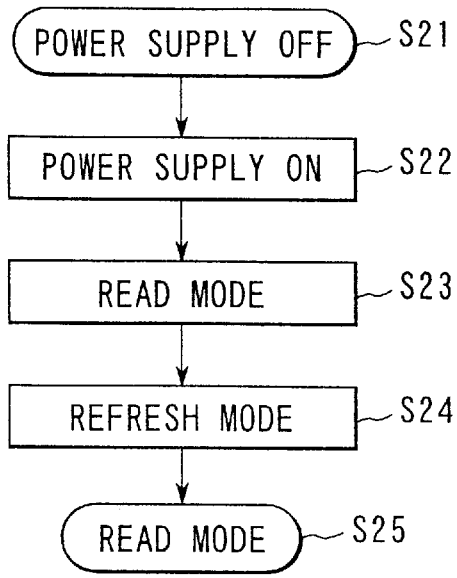
FIG. 6
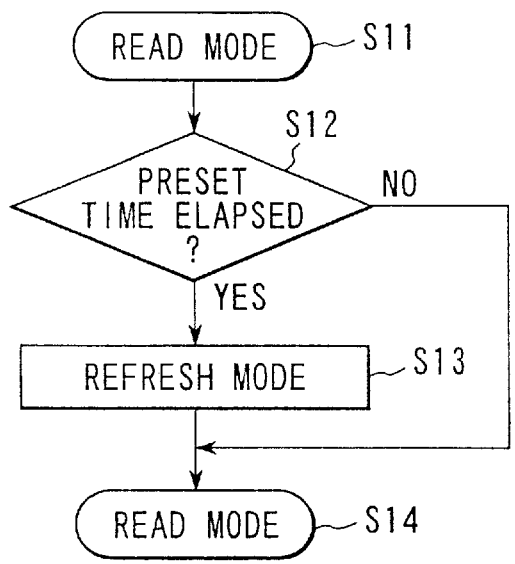
FIG. 7
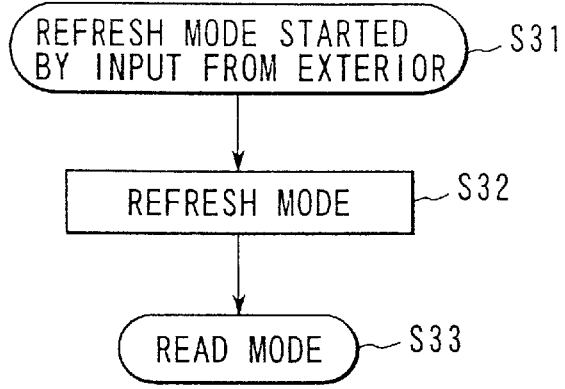
FIG. 8
FIG. 9

ELECTRICALLY ERASABLE AND PROGRAMMABLE NONVOLATILE SEMICONDUCTOR MEMORY DEVICE HAVING DATA HOLDING FUNCTION AND DATA HOLDING METHOD

CROSS-REFERENCE TO RELATED APPLICATION

This application is based upon and claims the benefit of priority from the prior Japanese Patent Application No. 11-027210, filed Feb. 4, 1999, the entire contents of which are incorporated herein by reference.

BACKGROUND OF THE INVENTION

This invention relates to a nonvolatile semiconductor memory device such as an electrically erasable and programmable ROM (EEPROM).

A conventional nonvolatile semiconductor memory device, in this example, EEPROM is explained below.

FIG. 1 is a block diagram showing the construction of the conventional EEPROM. In the EEPROM shown in FIG. 1, the operation for reading out data stored in memory cells of a cell array 102 is effected as follows.

Address data supplied via an address input bus is input to an address generating circuit 106 via an address input circuit 104.

The address generating circuit 106 generates a row address based on the input address data and outputs the row address to a row decoder 108. Further, the address generating circuit 106 generates a column address based on the input address data and outputs the column address to a column decoder 110. The row decoder 108 and column decoder 110 selects a memory cell to be subjected to the readout operation based on the input row address and column address.

Data of the memory cell selected by the row address and column address is read out by a readout circuit (sense amplifier) 112 via an internal data bus 112A and input to a data input/output circuit 114. Then, data input to the data input/output circuit 114 is output to the exterior via a data input/output bus 114A.

The program operation is effected as follows.

Write input data input to the data input/output circuit 114 via the data input/output bus 114A is input to a write circuit 116 and data comparator 118. Verify data read out in the program verify state and the input data are compared with each other in the data comparator 118 before the write operation and the result of comparison is output to an automatic write/erase operation control sequencer (which is hereinafter referred to as an operation control sequencer) 120.

If the result of comparison by the data comparator 118 indicates that "input data"="verify data", the operation control sequencer 120 does not effect the write operation. On the other hand, if "input data"≠"verify data", the operation control sequencer 120 outputs an operation mode signal, in this example, a signal for specifying the program mode to an internal voltage control circuit 122, switches a word line potential VWL and column potential VCO from the program verify potential state to the program potential state and then effects the write operation.

After the elapse of a preset program time, the operation control sequencer 120 outputs an operation mode signal, in this example, a signal for specifying the program verify to the internal voltage control circuit 122, restores the word line potential VWL and column potential VCO to the program verify potential state and then effects the readout operation (program verify) with respect to a memory cell into which data has been written.

Next, input data input to the data input circuit 114 and data read out in the program verify are compared with each other in the data comparator 118 and if every compared bits coincide with each other, the program operation is terminated. On the other hand, if any compared bits which do not coincide with each other are present, the operation control sequencer 120 specifies the write circuit 116 to effect the additional write operation again and thus effects the write operation.

Next, the current-voltage characteristic of the memory cell when the program operation (write operation) is effected is explained.

FIG. 2 is a diagram showing the current-voltage characteristic of the memory cell when data is written into the EEPROM and the current-voltage characteristic of a memory cell which is left as it is after the write operation. FIGS. 3A, 3B are schematic cross sectional views each showing the structure of the memory cell and the electrical state thereof.

Before data is written into the memory cell of the EPROM (in this case, it is assumed that data is erased), the threshold voltage Vth of the memory cell lies in a low level range. After this, if data is written into the memory cell, the threshold voltage Vth is shifted towards the high voltage side and is set to a high voltage as indicated by "A" in FIG. 2.

After execution of the write operation, it is determined (verified) whether data is correctly written or not by reading out data from the memory cell by use of a voltage higher than the voltage at the read time with a margin contained therein. In the memory cell into which data is written, stress is applied to the memory cell by access for reading or the like and electrons stored in the floating gate are extracted or leaked out.

The state of extraction of electrons stored in the floating gate is explained with reference to FIGS. 3A, 3B. A source (diffusion layer) 132 and drain (diffusion layer) 134 are formed in a semiconductor substrate 130 and a floating gate 136 is formed above the channel region with a gate insulating film 135 disposed therebetween. A control gate 138 is formed above the floating gate 136 with an insulating film 137 disposed therebetween. Immediately after the write operation, electrons are stored in the floating gate 136 as shown in FIG. 3A. After this, if stress is applied to the memory cell by access for reading or the like, electrons which have been stored in the floating gate 136 are gradually leaked or extracted via the drain 134 as shown in FIG. 3B. As a result, for example, the current-voltage characteristic as indicated by "B" in FIG. 2 may be obtained.

If the data readout operation is effected in the state indicated by "B" of FIG. 2, data which is the same as that in the programmed state can be read out since the threshold voltage Vth of the memory cell is higher than the voltage at the read time. However, if the data readout operation is effected by use of the voltage which is used for effecting the program verify, there occurs a possibility that the threshold voltage of the memory cell which is originally set as an "L" level cell is set into an "H" level cell and the memory cell is regarded as an erase cell since a cell current which is larger than the reference current can be derived. As a result, erroneous data may be read out.

That is, in a case wherein given data is programmed into a memory cell of the EEPROM in a nonvolatile semiconductor memory device such as the EEPROM and then programmed data is read out, there occurs a possibility that electrons stored in the floating gate may be extracted by stress at the read time or the like while the read operation is repeatedly effected, data will be erroneously recognized, and the reliability of data will be influenced.

In the conventional case, the above problem can be coped with by improving the film quality of an oxide film (tunnel oxide film) constructing the gate insulating film to suppress the amount of electrons which will be extracted or leaked. However, the absolute amount of electrons stored in the floating gate will be reduced as the device will be further miniaturized in the future. Therefore, it will be difficult to cope with the above problem only by improving the film quality of the oxide film.

BRIEF SUMMARY OF THE INVENTION

This invention has been made in order to solve the above problem and an object of this invention is to provide a nonvolatile semiconductor memory device and a data holding method capable of preventing written (programmed) data from being erroneously recognized and enhancing the reliability thereof.

In order to attain the above object, a nonvolatile semiconductor memory device according to this invention comprises nonvolatile memory cells capable of storing data; a readout circuit for reading out data of the memory cell by use of one of a first word line potential and a second word line potential; a data comparing circuit for comparing first data read out by use of the first word line potential with second data read out by use of the second word line potential; and a write circuit for writing data into the memory cell according to the result of comparison by the data comparing circuit.

It is preferable that the first word line potential is set to a word line potential used at the program verify time and the second word line potential is set to a potential lower than the word line potential used at the program verify time and equal to or higher than a word line potential used at the read time.

With the nonvolatile semiconductor memory device thus constructed, a given voltage is set between the voltage used at the program verify time and the voltage used at the read time, data read out by use of the given voltage is compared with data at the program time and an additional writing operation is effected only for a memory cell in which the compared data items are different from each other. As a result, erroneous recognition of data caused by extraction of charges stored in the floating gate can be prevented and the reliability thereof can be enhanced.

Further, in order to attain the above object, a data holding method of a nonvolatile semiconductor memory device according to this invention comprises a first readout step of reading out data of the memory cell by use of a first word line potential; a second readout step of reading out data of the memory cell by use of a second word line potential; a comparing step of comparing data read out in the first readout step with data read out in the second readout step; and a step of writing data into the memory cell according to the result of comparison in the comparing step.

It is preferable that the first word line potential is set to a word line potential used at the program verify time and the second word line potential is set to a potential lower than the word line potential used at the program verify time and equal to or higher than a word line potential used at the read time.

With the data holding method of the nonvolatile semiconductor memory device thus constructed, a given voltage is set between the voltage used at the program verify time and the voltage used at the read time, data read out by use of the given voltage is compared with data at the program time and an additional writing operation is effected only for a memory cell in which the compared data items are different from each other. As a result, erroneous recognition of data caused by extraction of charges stored in the floating gate can be prevented and the reliability thereof can be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a table showing the conditions of program verify data DPV and refresh verify data DRV in a case where the additional write operation is effected;

FIG. 7 is a flowchart for illustrating the operation in a case where the refresh mode is started in the read mode operation;

FIG. 8 is a flowchart for illustrating the operation in a case where the refresh mode is started when the power supply is turned ON;

FIG. 9 is a flowchart for illustrating the operation in a case where the refresh mode is started by use of a command input from the exterior;

DETAILED DESCRIPTION OF THE INVENTION

There will now be described embodiments of this invention with reference to the accompanying drawings.

[First Embodiment]

First, a nonvolatile semiconductor memory device according to a first embodiment of this invention is explained. In this example, an electrically erasable and programmable memory (EEPROM: Electrically Erasable and Programmable ROM) is used as the nonvolatile semiconductor memory device.

Figure 4:
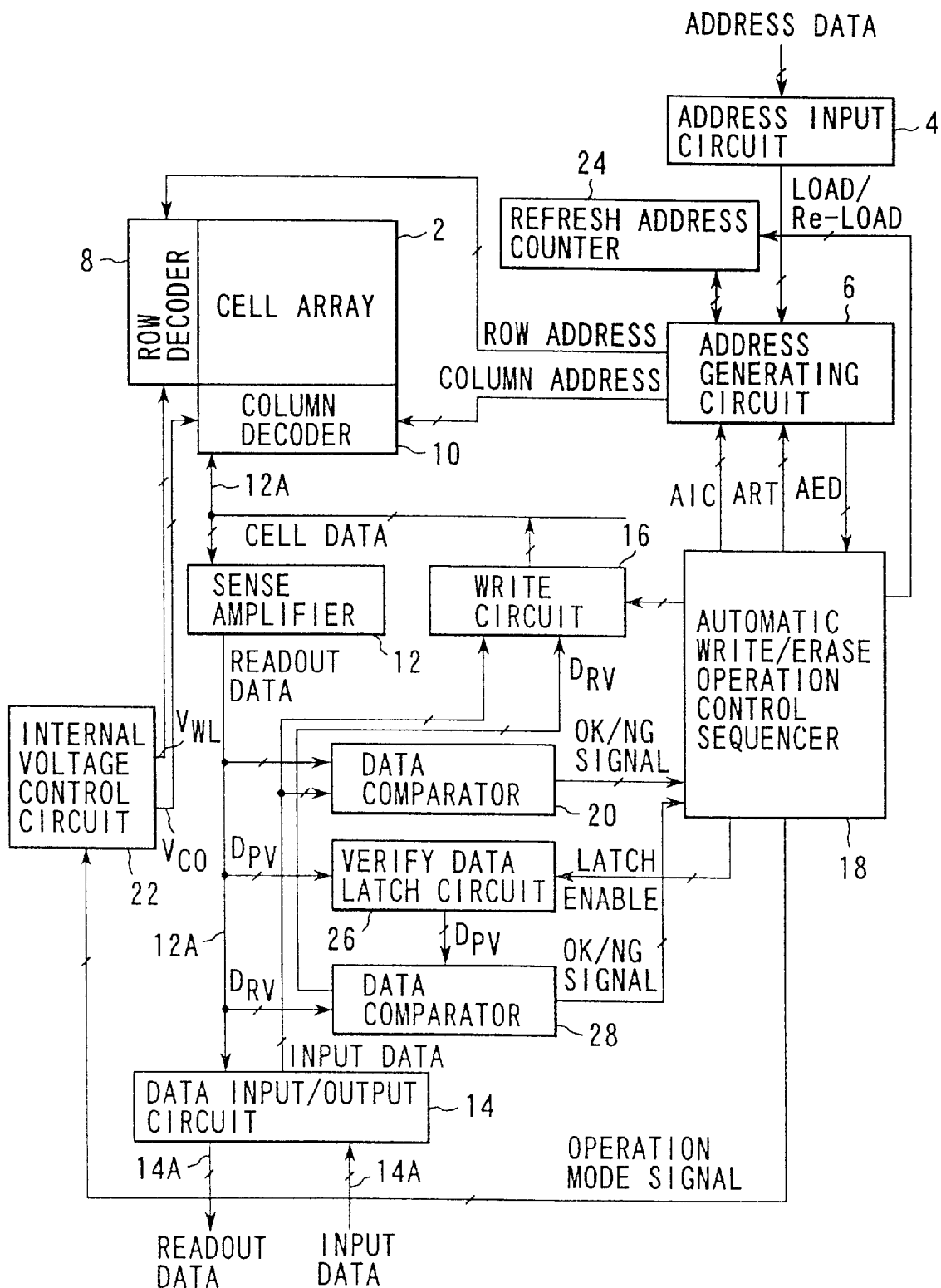
FIG. 4 is a block diagram showing the construction of a nonvolatile semiconductor memory device according to a first embodiment of this invention.

FIG. 4 is a block diagram showing the construction of an EEPROM according to the first embodiment. The EEPROM includes a cell array 2, address input circuit 4, address generating circuit 6, row decoder 8 and column decoder 10, readout circuit (sense amplifier) 12, data input/output circuit 14, write circuit 16, automatic write/erase operation control sequencer (which is hereinafter referred to as an operation control sequencer) 18, data comparator 20, internal voltage control circuit 22, refresh address counter 24, verify data latch circuit 26 and data comparator 28.

The cell array 2 is constructed by arranging memory cells capable of storing data in an array form. The address input circuit 4 receives address data from the exterior. The address generating circuit 6 generates a row address and column address. The row decoder 8 and column decoder 10 select one of the memory cells which is subjected to the readout or program (write) operation based on the row address or column address. The readout circuit (sense amplifier) 12 reads out data from the memory cell. The data input/output circuit 14 inputs or outputs data with respect to the exterior. The write circuit 16 is a circuit for writing data into the memory cell.

Further, the automatic write/erase operation control sequencer (which is hereinafter referred to an operation control sequencer) 18 controls the automatic write operation or erase operation. The data comparator 20 compares write data with readout data. The internal voltage control circuit 22 controls the internal voltage of the memory cell. The refresh address counter 24 stores an address which is now used in a refresh mode which will be described later in order to execute the interruption mode. The verify data latch circuit 26 latches data read out by use of a word line potential which is the same as that used at the program verify time. The data comparator 28 compares data latched in the verify data latch circuit 26 with data read out by use of a word line potential which is lower than that used at the program verify time and higher than that used at the read time.

In the EEPROM of the first embodiment, the operation for reading out data stored in the memory cell in the cell array 2 is effected as follows.

Address data supplied via the address input bus is input to the address generating circuit 6 via the address input circuit 4. The address generating circuit 6 generates a row address and column address based on the input address data and respectively outputs the addresses to the row decoder 8 and column decoder 10. The row decoder 8 and column decoder 10 select a memory cell which is subjected to the readout operation based on the input row address and column address.

Data of a memory cell selected by the row decoder 8 and column decoder 10 is read out via an internal data bus 12A by the readout circuit (sense amplifier) 12 and input to the data input/output circuit 14. Then, data input to the data input/output circuit 14 is output to the exterior via a data input/output bus 14A.

The program operation in the EEPROM of the first embodiment is effected as follows.

Input data for writing is input to the data input/output circuit 14 via the data input/output bus 14A. The input data input to the data input/output circuit 14 is input to the write circuit 16 and data comparator 20. Before writing, verify data read out in the program verify state is input to the data comparator 20 and the input data and verify data are compared in the data comparator 20.

If the result of comparison by the data comparator 20 indicates that "input data"="verify data", the operation control sequencer 18 does not effect the write operation. On the other hand, if "input data"≠"verify data", the operation control sequencer 18 gives an instruction to the internal voltage control circuit 22 to switch a word line potential VWL supplied to the row decoder 8 and column potential VCO supplied to the column decoder 10 to potentials used at the program time and then effects the write operation.

After the elapse of a preset program time, the operation control sequencer 18 gives an instruction to the internal voltage control circuit 22 to restore the word line potential VWL and column potential VCO to the potential state set at the program verify time and then effects the readout operation (program verify) with respect to a memory cell into which data has been written. Then, input data input to the data input circuit 14 and readout data in the program verify are compared with each other in the data comparator 20 and if every compared bits coincide with each other, the program operation is terminated. On the other hand, if any compared bits which do not coincide with each other are present, the operation control sequencer 18 specifies the write circuit 16 to effect the additional write operation again and thus effects the write operation.

The EEPROM of the first embodiment has a refresh mode which will be described later in addition to the normal operation modes such as the program, program verify, erase, erase verify and read modes. The refresh mode operation is explained below.

Figure 5:
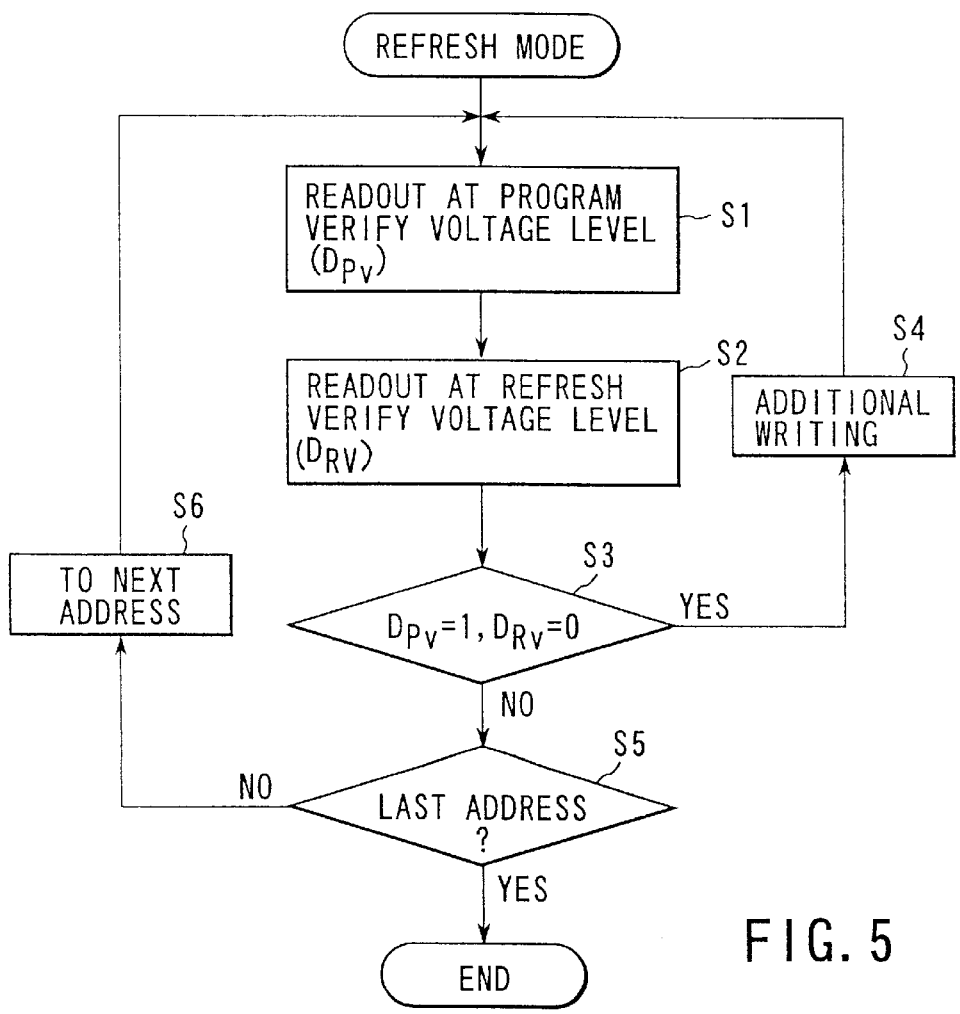
FIG. 5 is a flowchart for illustrating the operation of a refresh mode in the nonvolatile semiconductor memory device according to the first embodiment.

FIG. 5 is a flowchart for illustrating the operation of the refresh mode.

The refresh mode is started by the automatic write/erase operation control sequencer 18. Then, the operation control sequencer 18 outputs an address reset signal ART to the address generating circuit 6 so as to initialize the address counter in the address generating circuit 6. After this, it effects the readout operation of cell data with respect to the memory cell of the top address by use of the same word line potential as that used at the program verify time. Program verify (PV) data DPV thus read out is latched in the verify data latch circuit 26 (step S1).

Next, the operation control sequencer 18 outputs an operation mode signal, in this example, a signal used for generating the internal voltage at the refresh mode time to the internal voltage control circuit 22. Then, a second readout operation (refresh verify) is effected (step S2) by use of a word line potential (refresh verify voltage) which is lower than the word line potential VWL at the program verify time and higher than the word line potential at the read time. Data read out at this time is used as refresh verify (RV) data DRV. The refresh verify voltage is set to an intermediate voltage between a voltage which is lower than the word line potential at the program verify time and higher than the word line potential at the read time, that is, the word line potential at the program verify time and the word line potential at the read time.

Next, the program verify (PV) data DPV and refresh verify (RV) data DRV thus read out are compared with each other by the data comparator 28 (step S3). If the result of comparison indicates that the data DPV is "1" and the data DRV is "0" as shown in FIG. 6, there occurs a possibility that erroneous recognition may occur in the future due to extraction or leakage of charges stored in the floating gate. Therefore, the additional write operation is effected for the memory cell in which the data DPV is set to "1" and the data DRV is set to "0" (step S4). Since there occurs no possibility of erroneous recognition in a case other than the case where the data DPV is set at "1" and the data DRV is set at "0", the step S5 is effected without effecting the additional write operation.

Next, after the additional write operation was effected in the step S4, the step S1 is effected to verify data obtained after the additional write operation. First, the operation control sequencer 18 effects the readout operation of cell data with respect to the memory cell by use of the word line potential which is the same as that at the program verify time. Then, the readout data DPV is latched in the verify data latch circuit 26 (step S1).

Further, the operation control sequencer 18 effects the readout operation (refresh verify) of cell data with respect to the memory cell by use of the word line potential (refresh verify voltage) which is lower than the word line potential at the program verify time and higher than the word line potential at the read time (step S2). Like the above case, data read out at this time is used as refresh verify (RV) data DRV. Also, in this case, the refresh verify voltage is set to a voltage which is lower than the word line potential at the program verify time and higher than the word line potential at the read time.

Next, the program verify (PV) data DPV and refresh verify (RV) data DRV thus read out are compared with each other by the data comparator 28 (step S3). If the result of comparison indicates that the data DPV is "1" and the data DRV is "0" as shown in FIG. 6, it is determined that the additional write operation has not been correctly effected. Therefore, the additional write operation is effected for the memory cell in which the data DPV is set to "1" and the data DRV is set to "0" (step S4). Since it is determined that the additional write operation is correctly effected in a case other than the case where the data DPV is set at "1" and the data DRV is set at "0" and the step S5 is effected without effecting the additional write operation again. Thus, the steps S1 to S4 are repeatedly effected until a case where the data DPV is set at "1" and the data DRV is set at "0" does not occur.

In the step S5, the operation control sequencer 18 determines whether or not the memory cell subjected to the readout operation is a memory cell corresponding to the last address based on an address end signal AED output from the address generating circuit 6 (step S6). If the result of determination indicates that it is not the last address, the operation control sequencer 18 outputs an address increment signal AIC to the address generating circuit 6 to increment the address ("+1") to effect the refresh operation for a next address. Further, if it is the last address, the refresh mode is terminated. As described above, the refresh operation in the refresh mode is continuously effected from the top address to the last address.

The program which describes the refresh mode operation is stored in various types of storage media. As the storage media, various storage media such as a semiconductor memory, magnetic disk, floppy disk, hard disk, optical disk, magnet-optical disk which can store the program and can be read by a computer can be used and any type of storage form can be used.

Next, a series of operations of the EEPROM in a case where the refresh mode is started is explained.

A case wherein the refresh mode is started in the read mode operation is explained below.

FIG. 7 is a flowchart for illustrating the operation in a case where the refresh mode is started in the read mode operation.

First, when the EEPROM is set into the read mode state (step S11), the automatic write/erase operation control sequencer 18 determines whether or not a preset period of time has elapsed after it is set into the read mode state (step S12). If the preset period of time does not elapse, the read mode state is maintained. If the preset period of time has elapsed, the operation control sequencer 18 starts the refresh mode shown in FIG. 5 (step S13). After the refresh mode is executed, the process returns to the read mode (step S14). The preset period of time is set to a period of time during which true data can be obtained when the readout operation is effected by use of the refresh verify voltage in a case where charges stored in the floating gate of the memory cell are gradually extracted by stress caused by the readout operation or the like.

As described before, by starting the refresh mode for each preset time during the read mode operation, erroneous recognition of data caused by extraction of charges stored in the floating gate due to stress caused by the readout operation or the like can be prevented.

The operation effected when the refresh mode is started when the power supply is turned ON is explained below.

FIG. 8 is a flowchart for illustrating the operation in a case where the refresh mode is started when the power supply is turned ON.

First, assume that the power supply of the EEPROM is changed from the OFF state (step S21) to the ON state (step S22). Then, the read mode is executed (step S23). When the read mode is terminated, the automatic write/erase operation control sequencer 18 starts the refresh mode shown in FIG. 5 (step S24). After the refresh mode is executed, the process returns to the read mode (step S25).

As described before, by starting the refresh mode after the power supply is turned ON and the read mode operation is effected, erroneous recognition of data caused by extraction of charges stored in the floating gate can be prevented.

Next, a case wherein the refresh mode is started by use of a command input from the exterior is explained below.

FIG. 9 is a flowchart for illustrating the operation in a case where the refresh mode is started by use of a command input from the exterior.

For example, a command of refresh mode other than the JEDEC standard command is newly provided. If the new command is input from the exterior (step S31) and the refresh mode is set up, the automatic write/erase operation control sequencer 18 starts the refresh mode (step S32). Then, after the refresh mode is executed, the process returns to the read mode (step S33).

As described before, by starting the refresh mode by use of the command input from the exterior, erroneous recognition of data caused by extraction of charges stored in the floating gate can be prevented.

Further, the operation for always permitting the refresh mode to be started in an operation mode other than the read, program/program verify, erase/erase verify and power save (suppression of power consumption) modes is explained below.

Figure 10:
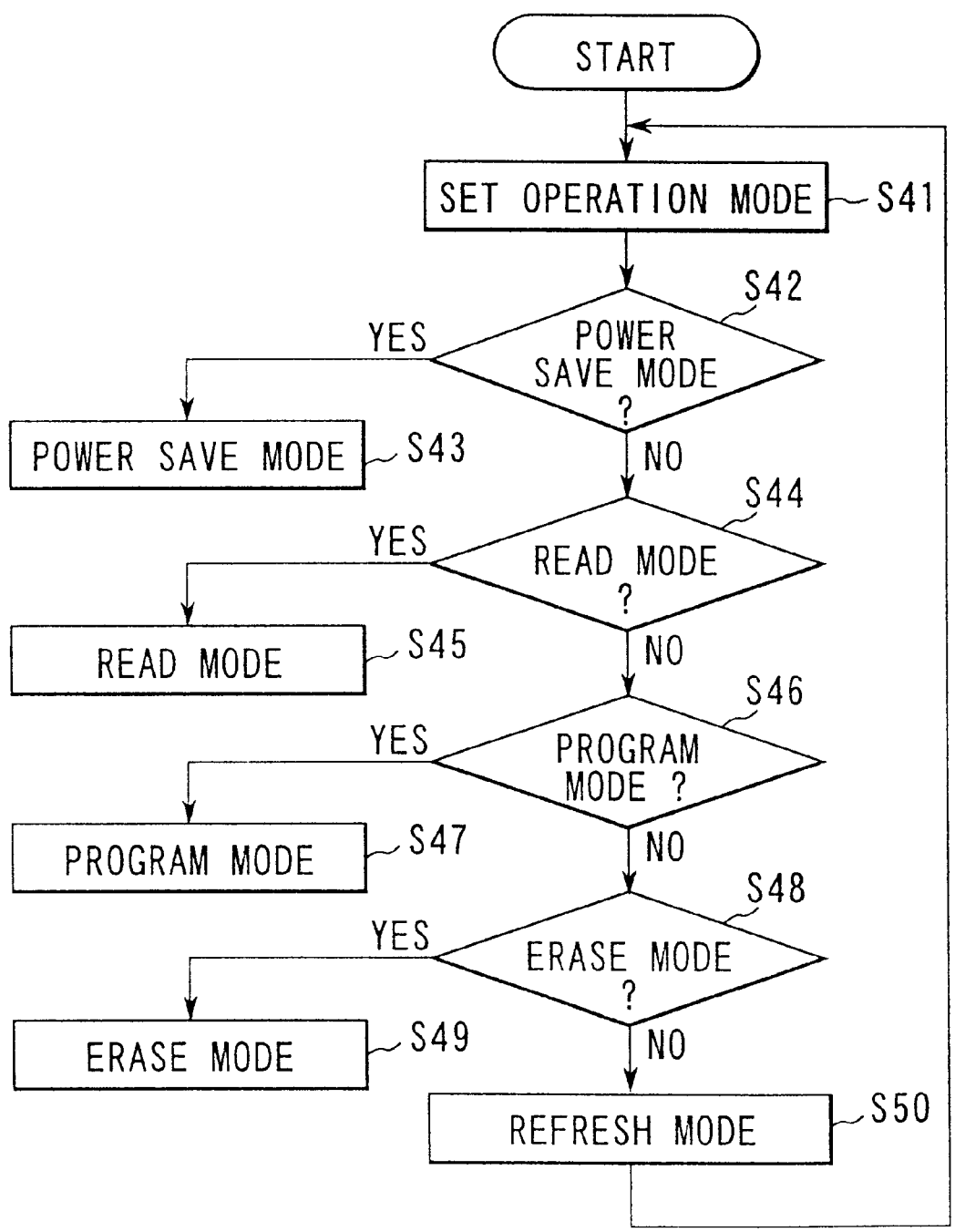
FIG. 10 is a flowchart for illustrating the operation in a case where the refresh mode is always permitted to be started in an operation mode other than the read, program/program verify, erase/erase verify and power save (suppression of power consumption) modes.

FIG. 10 is a flowchart for illustrating the operation in a case where the refresh mode is started in an operation mode other than the read, program/program verify, erase/erase verify and power save (suppression of power consumption) modes.

First, the operation mode of the EEPROM is set (step S41). Then, the automatic write/erase operation control sequencer 18 determines whether the operation mode set is a power save mode or not (step S42). If it is the power save mode, the power save mode is executed (step S43). If it is not the power save mode, the operation control sequencer 18 determines whether the operation mode set is the read mode or not (step S44). If it is the read mode, the read mode is executed (step S45).

If it is not the read mode, the operation control sequencer 18 determines whether the operation mode set is the program mode or not (step S46). If it is the program mode, the program mode is executed (step S47). If it is not the program mode, the operation control sequencer 18 determines whether the operation mode set is the erase mode or not (step S48). If it is the erase mode, the erase mode is executed (step S49).

If it is not the erase mode, the operation control sequencer 18 starts the refresh mode shown in FIG. 5 (step S50). After the refresh mode executed, the operation for setting the operation mode in the step S41 is effected.

If a mode such as a read, program/program verify, or erase/erase verify mode is requested during execution of the refresh mode, the address which is now used is loaded into the refresh address counter 24, the refresh mode is temporarily interrupted and the requested mode is executed. If the interruption mode is terminated, the operation control sequencer 18 re-starts the refresh mode and re-loads the address stored in the refresh address counter 24 into the address generating circuit 6. Then, the interrupted refresh operation is re-started from the address at which the refresh operation was interrupted.

As described before, by always permitting the refresh mode to be started in a mode other than the program/program verify, erase/erase verify and power save (suppression of power consumption) modes, erroneous recognition of data caused by extraction of charges stored in the floating gate can be prevented.

As described above, according to the first embodiment, erroneous recognition of data stored in the memory cell can be prevented and the reliability thereof can be enhanced by providing a given voltage of refresh verify between the voltage at the read time and the voltage at the program verify time, comparing data read out by use of the refresh verify voltage and data at the program time with each other and effecting the additional write operation only for the memory cell in which compared data items are different from each other.

[Second Embodiment]

Next, a nonvolatile semiconductor memory device according to a second embodiment of this invention, in this example, an EEPROM is explained.

Figure 11:
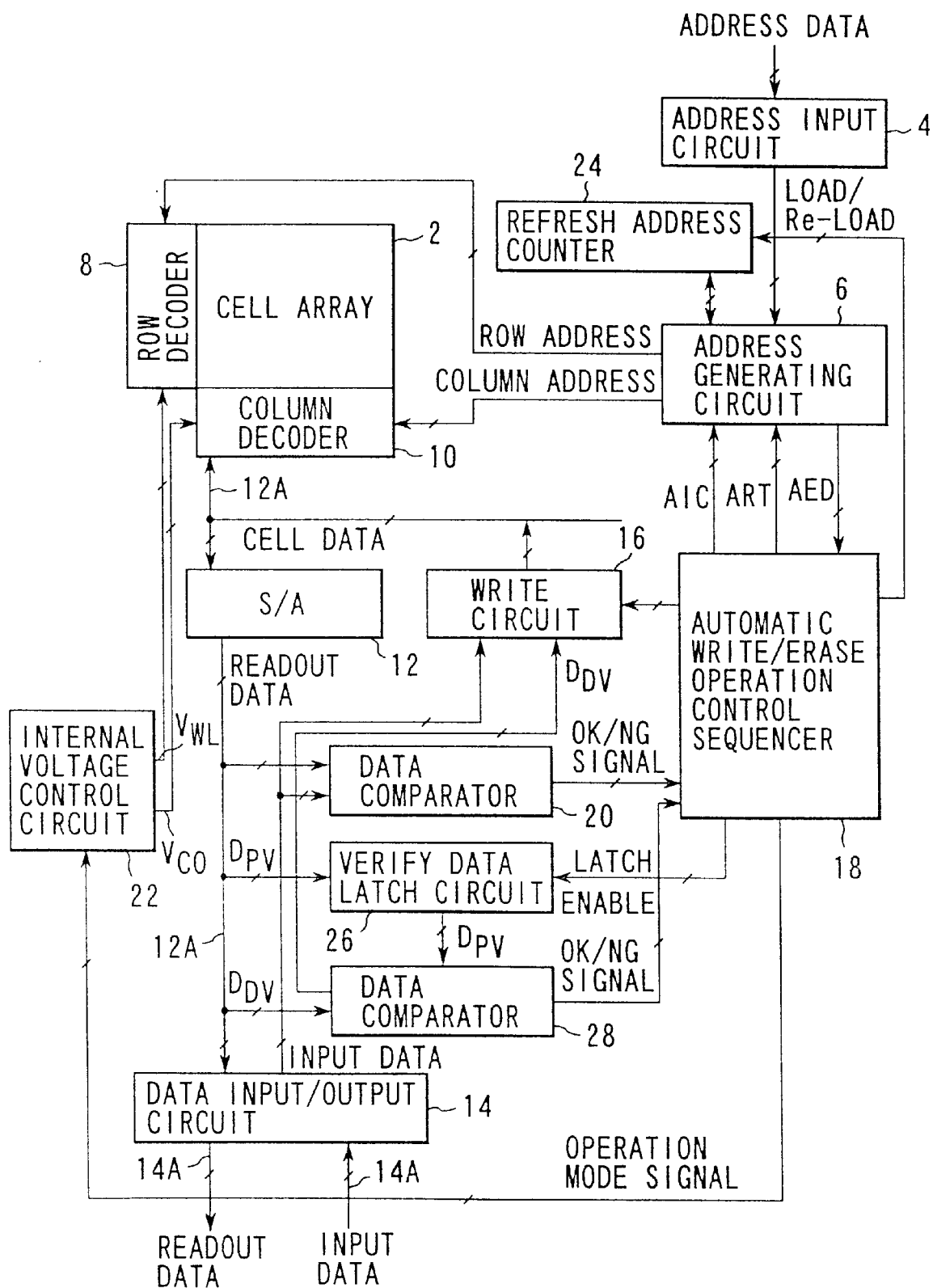
FIG. 11 is a block diagram showing the construction of a nonvolatile semiconductor memory device according to a second embodiment of this invention.

FIG. 11 is a block diagram showing the construction of the EEPROM according to the second embodiment.

Figure 1:
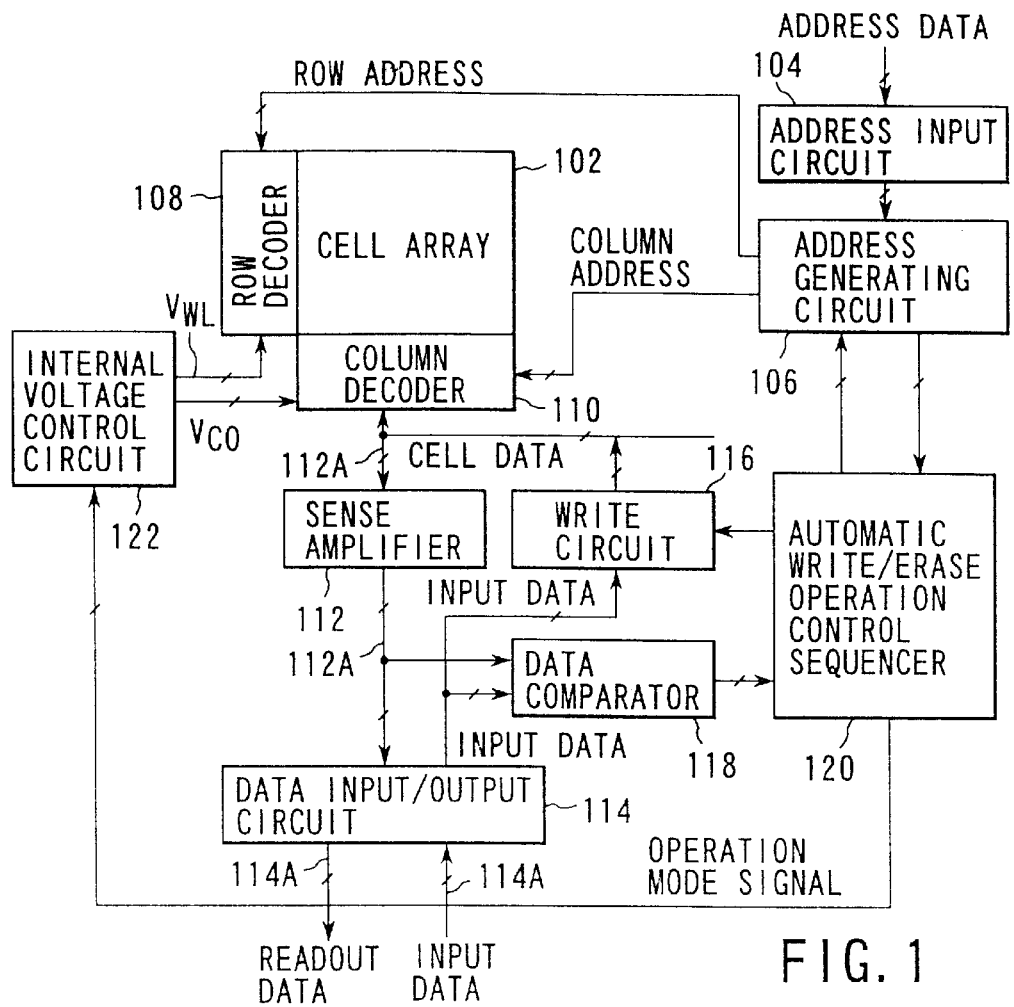
FIG. 1 is a block diagram showing the construction of a conventional nonvolatile semiconductor memory device.
Figure 2:
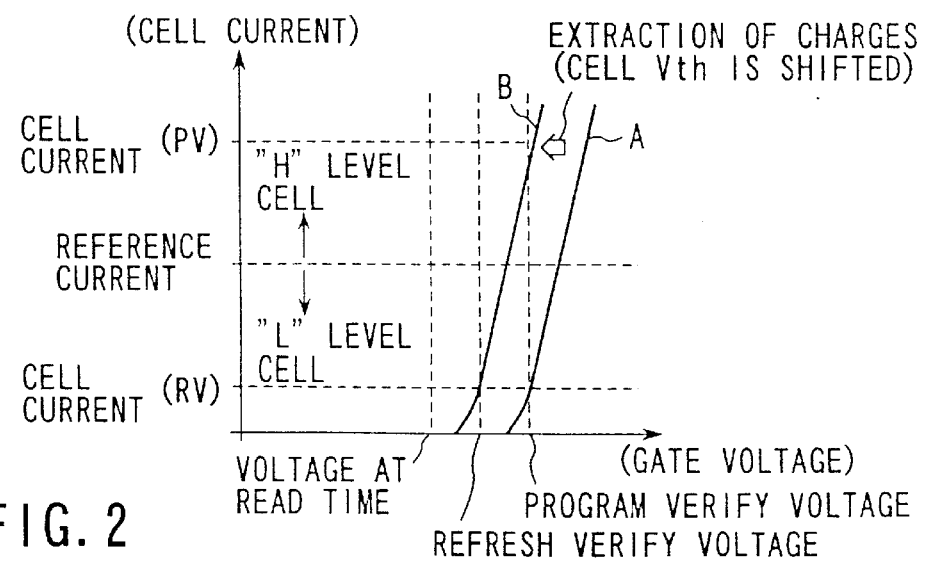
FIG. 2 is a graph showing the current-voltage characteristic of a memory cell in a case where the write operation is effected with respect to the conventional nonvolatile semiconductor memory device and the current-voltage characteristic of the memory cell in a case where the memory device is left as it is after the write operation is effected.
Figure 3A:
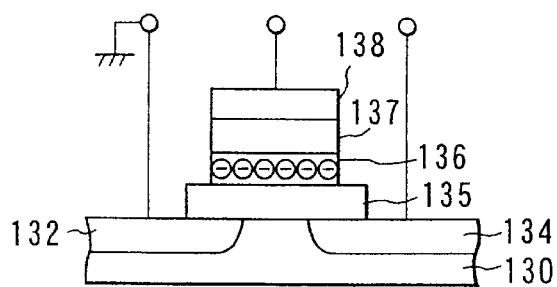
FIGS. 3A and 3B are schematic cross sectional views each showing the structure and electrical state of a memory cell of the conventional nonvolatile semiconductor memory device.
Figure 3B:
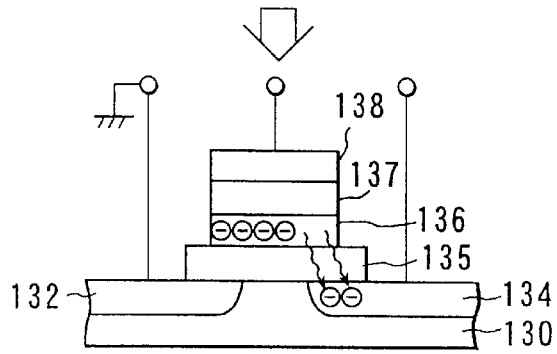

The construction of the nonvolatile semiconductor memory device of the second embodiment is obtained by replacing the refresh verify (RV) data in the construction of the EEPROM of the first embodiment shown in FIG. 1 by data DDV read out by use of the word line potential at the read time and the other portion is the same as that of the first embodiment.

In the first embodiment, memory cell data is read out by use of the word line potential (refresh verify voltage) which is lower than the word line potential used at the program verify time and higher than the word line potential used at the read time. However, in the second embodiment, data of the memory cell is read out by use of the word line potential at the read time. Data DDV read out by use of the word line potential at the read time and data DPV read out by use of the word line potential at the program verify time are compared with each other to determine whether the additional write operation is to be effected or not. Further, the readout operation and the program operation of the EEPROM of the second embodiment are the same as those of the first embodiment.

Like the first embodiment, the EEPROM of the second embodiment has a refresh mode which will be described later in addition to the normal operation modes such as the program/program verify, erase/erase verify and read modes. The operation of the refresh mode is as follows.

Figures 12, 13:
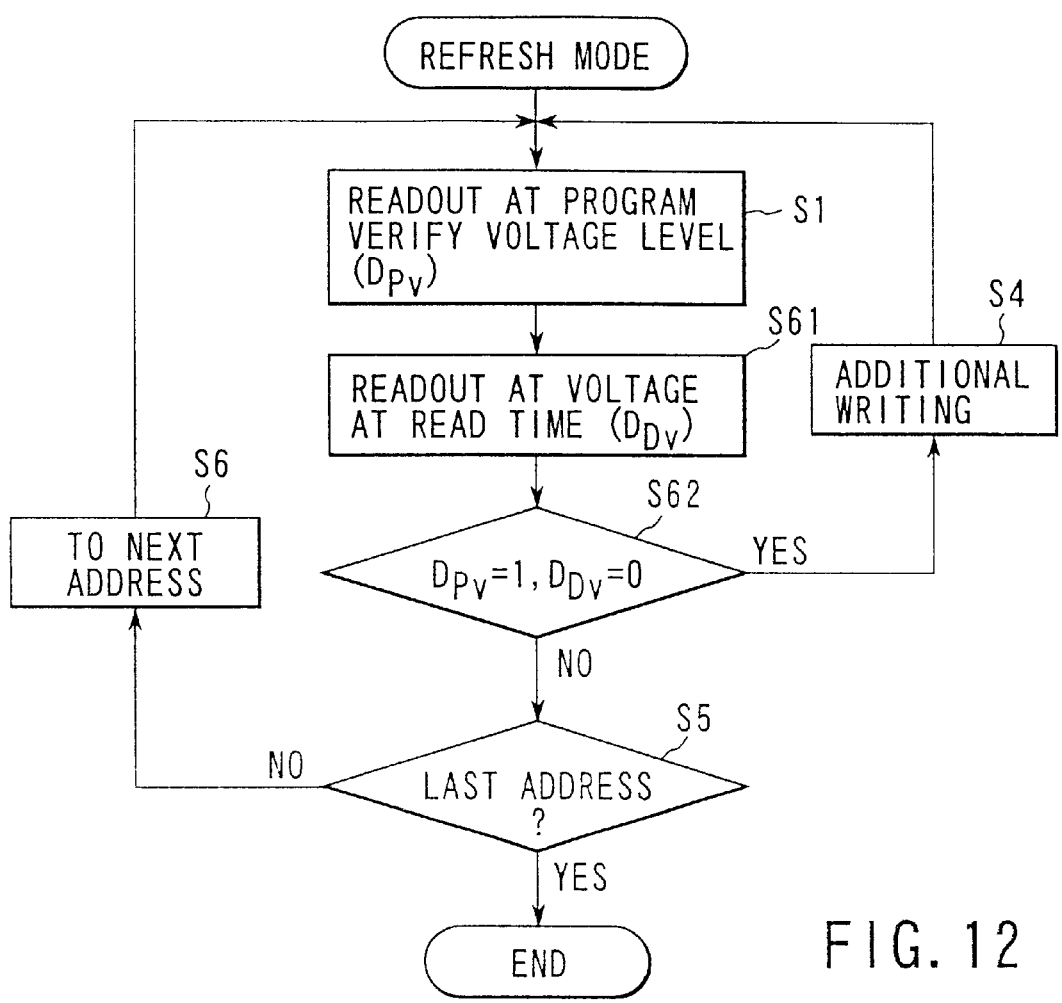
FIG. 12 is a flowchart for illustrating the operation of a refresh mode in the nonvolatile semiconductor memory device according to the second embodiment.
FIG. 13 is a table showing the conditions of program verify data DPV and refresh verify data DRV in a case where the additional write operation is effected.

FIG. 12 is a flowchart for illustrating the operation of the refresh mode.

The refresh mode is started by an automatic write/erase operation control sequencer 18. Then, the operation control sequencer 18 outputs an address reset signal ART to an address generating circuit 6 to initialize the address counter of the address generating circuit 6. After this, the operation for reading out cell data is effected with respect to a memory cell of the top address by use of the same word line potential as that used at the program verify time. Program verify (PV) data DPV thus read out is latched into a verify data latch circuit 26 (step S1).

Next, the operation control sequencer 18 outputs an operation mode signal, in this example, a signal used for generating an internal voltage at the read time to an internal voltage control circuit 22. Then, a second readout operation (refresh verify) is effected by use of the same word line potential as that used at the read time (step S61). Data read out at this time is used as data DDV.

The readout program verify (PV) data DPV and data DDV are compared with each other by a data comparator 28 (step S62). If the result of comparison indicates that the data DPV is "1" and the data DDV is "0" as shown in FIG. 13, there occurs a possibility that erroneous recognition may occur in the future due to extraction of charges stored in the floating gate. Therefore, the additional write operation is effected for the memory cell in which the data DPV is set at "1" and the data DDV is set at "0" (step S4). Since there occurs no possibility of erroneous recognition in a case other than the case where the data DPV is set at "1" and the data DDV is set at "0", the step S5 is effected without effecting the additional write operation.

Next, after the additional write operation was effected in the step S4, the step S1 is effected to verify data obtained after the additional write operation. First, the operation control sequencer 18 effects the readout operation of cell data with respect to the memory cell by use of the word line potential which is the same as that at the program verify time. Then, readout data DPV is latched in the verify data latch circuit 26 (step S1).

Further, the operation control sequencer 18 effects the readout operation (refresh verify) of cell data with respect to the memory cell by use of the word line potential which is the same as the word line potential at the read time (step S61). Like the above case, data read out at this time is used as data DDV.

After this, the readout program verify (PV) data DPV and data DDV are compared with each other by a data comparator 28 (step S62). If the result of comparison indicates that the data DPV is "1" and the data DDV is "0" as shown in FIG. 13, it is determined that the additional write operation is not correctly effected. Therefore, the additional write operation is effected for the memory cell in which the data DPV is set at "1" and the data DDV is set at "0" (step S4). In a case other than the case where the data DPV is set at "1" and the data DDV is set at "0", it is determined that the additional write operation is correctly effected and the step S5 is effected without effecting the additional write operation again. Thus, the steps S1, S61, S62, S4 are repeatedly effected until a case where the data DPV is set at "1" and the data DDV is set at "0" does not occur.

In the step S5, the operation control sequencer 18 determines whether or not the memory cell subjected to the readout operation is a memory cell corresponding to the last address based on an address end signal AED output from the address generating circuit 6 (step S6). If the result of determination indicates that it is not the last address, the operation control sequencer 18 outputs an address increment signal AIC to the address generating circuit 6 to increment the address ("+1") to effect the refresh operation for a next address. Further, if it is the last address, the refresh mode is terminated. As described above, the refresh operation in the refresh mode is continuously effected from the top address to the last address.

Next, a series of operations in the EEPROM of the second embodiment in a case where the refresh mode is started is explained.

The operation effected in a case where the refresh mode is started in the read mode operation is explained by use of the flowchart of FIG. 7.

First, when the EEPROM is set into the read mode state (step S11), the automatic write/erase operation control sequencer 18 determines whether or not a preset period of time has elapsed after it is set into the read mode state (step S12). If the preset period of time does not elapse, the read mode state is maintained. If the preset period of time has elapsed, the operation control sequencer 18 starts the refresh mode shown in FIG. 12 (step S13). After the refresh mode is executed, the process returns to the read mode (step S14). The preset period of time is set to a period of time during which true data can be obtained when the readout operation is effected by use of the word line potential which is the same as that at the read time in a case where charges stored in the floating gate of the memory cell are gradually extracted by stress caused by the readout operation or the like.

As described before, by starting the refresh mode for each preset time during the read mode operation, erroneous recognition of data caused by extraction of charges stored in the floating gate due to stress caused by the readout operation or the like can be prevented.

The operation effected in a case where the refresh mode is started when the power supply is turned ON is explained by use of the flowchart shown in FIG. 8.

First, assume that the EEPROM is changed from the power supply OFF state (step S21) to the power ON state (step S2). Then, the read mode is executed (step S23). When the read mode is terminated, the automatic write/erase operation control sequencer 18 starts the refresh mode shown in FIG. 12 (step S24). After the refresh mode is executed, the process returns to the read mode (step S25).

As described before, by starting the refresh mode after the power supply is turned ON and the read mode is effected, erroneous recognition of data caused by extraction of charges stored in the floating gate can be prevented.

Next, the operation effected when the refresh mode is started by use of a command input from the exterior is explained by use of the flowchart of FIG. 9.

For example, a command of refresh mode other than the JEDEC standard command is newly provided. If the new command is input from the exterior (step S31) and the refresh mode is set up, the automatic write/erase operation control sequencer 18 starts the refresh mode shown in FIG. 12 (step S32). Then, after the refresh mode is executed, the process returns to the read mode (step S33).

As described before, by starting the refresh mode by use of the command input from the exterior, erroneous recognition of data caused by extraction of charges stored in the floating gate can be prevented.

Next, the operation for always permitting the refresh mode to be started in a mode other than the read, program/program verify, erase/erase verify, power save (suppression of power consumption) modes is explained by use of the flowchart of FIG. 10.

First, the operation mode of the EEPROM is set (step S41). Then, the automatic write/erase operation control sequencer 18 determines whether the operation mode set is a power save mode or not (step S42). If it is the power save mode, the power save mode is executed (step S43). If it not the power save mode, the operation control sequencer 18 determines whether the operation mode set is the read mode or not (step S44). If it is the read mode, the read mode is executed (step S45).

If it is not the read mode, the operation control sequencer 18 determines whether the operation mode set is the program mode or not (step S46). If it is the program mode, the program mode is executed (step S47). If it is not the program mode, the operation control sequencer 18 determines whether the operation mode set is the erase mode or not (step S48). If it is the erase mode, the erase mode is executed (step S49).

If it is not the erase mode, the operation control sequencer 18 starts the refresh mode shown in FIG. 12 (step S50). After the refresh mode executed, the operation for setting the operation mode in the step S41 is effected.

Like the first embodiment, if a mode such as a read, program/program verify, or erase/erase verify mode is requested during execution of the refresh mode, the address which is now used is loaded into the refresh address counter 24, the refresh mode is temporarily interrupted and the requested mode is executed. If the interruption mode is terminated, the operation control sequencer 18 re-starts the refresh mode and re-loads the address stored in the refresh address counter 24 into the address generating circuit 6. Then, the interrupted refresh operation is re-started from the address at which the refresh mode was interrupted.

As described before, by always permitting the refresh mode to be started in a mode other than the program/program verify, erase/erase verify and power save (suppression of power consumption) modes, erroneous recognition of data caused by extraction of charges stored in the floating gate can be prevented.

As described above, according to the second embodiment, erroneous recognition of written data can be prevented and the reliability thereof can be enhanced by comparing data read out by use of the voltage at the read time and data at the program time with each other and effecting the additional write operation only for the memory cell in which extraction of charges occurs without providing a given voltage of refresh verify between the voltage at the read time and the voltage at the program verify time. In the second embodiment, since it is not necessary to provide a given voltage of refresh verify for detecting a memory cell in which extraction of charges occurs between the voltage at the read time and the voltage at the program verify time, the device construction can be made simple.

According to the above embodiments, in order to cope with a phenomenon that charges stored in the floating gate by the data writing operation or the like are gradually extracted due to stress or the like applied to the memory cell in a nonvolatile semiconductor memory device such as an EEPROM, measures are taken not for the manufacturing process, but for the circuit so as to suppress a fluctuation due to the process, thereby enhancing the manufacturing yield and enhancing the reliability of written data.

Further, in the above embodiments, in a nonvolatile semiconductor memory device such as an EEPROM, measures are taken for the circuit so as to prevent a change of data due to extraction of charges in the floating gate by providing the refresh mode in addition to the program/erase command registered as the JEDEC standard command, starting the refresh mode to effect the readout operation for all of the memory cells when access to the memory cell is not made, and effecting the additional write operation only for a memory cell which is subjected to the write operation if it does not satisfy a certain condition. As a result, the reliability of data programmed on the user side can be enhanced.

As described above, according to this invention, a nonvolatile semiconductor memory device can be provided in which erroneous recognition of written data can be prevented and the reliability thereof can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   nonvolatile memory cells capable of storing data;
   a readout circuit for reading out data of said memory cell by use of one of a first word line potential and a second word line potential;
   a data comparing circuit for comparing first data read out by use of said first word line potential with second data read out by use of said second word line potential; and
   a write circuit for writing data into said memory cell according to the result of comparison by said data comparing circuit.

2. A nonvolatile semiconductor memory device according to claim 1, wherein the first word line potential is set to a word line potential set at the program verify time and the second word line potential is set to a word line potential lower than the word line potential set at the program verify time and not lower than a word line potential set at the read time.

3. A nonvolatile semiconductor memory device according to claim 1, wherein the first word line potential is set to a word line potential set at the program verify time and the second word line potential is set to a word line potential set at the read time.

4. A nonvolatile semiconductor memory device according to claim 2, wherein the program verify is an operation for reading out programmed data after the program operation is effected and verifying whether the data is stored as desired data or not.

5. A nonvolatile semiconductor memory device according to claim 3, wherein the program verify is an operation for reading out programmed data after the program operation is effected and verifying whether the data is stored as desired data or not.

6. A nonvolatile semiconductor memory device comprising:
   nonvolatile memory cells capable of storing data;
   an address generating circuit for generating a row address and column address based on address data;
   a decoder for selecting a memory cell which is to be subjected to the read/write operation based on the row address and column address;
   a readout circuit for reading out data from the memory cell selected by said decoder;
   a write circuit for writing data into the memory cell selected by said decoder;
   a voltage control circuit for controlling potentials of word lines connected to said memory cells;
   a verify data latch circuit for latching data read out by said readout circuit by use of a word line potential at the program verify time set by said voltage control circuit;
   a data comparing circuit for comparing data latched by said verify data latch circuit with data read out by said readout circuit by use of the word line potential which is set by said voltage control circuit to be lower than that at the program verify time and higher than that at the read time; and
   an operation control circuit for controlling whether or not the write operation by said write circuit is to be effected according to the result of comparison by said data comparing circuit.

7. A data holding method of a nonvolatile semiconductor memory device, for holding data stored in nonvolatile memory cells comprising:
   a first readout step of reading out data of the memory cell by use of a first word line potential;
   a second readout step of reading out data of the memory cell by use of a second word line potential;
   a comparing step of comparing data read out in said first readout step with data read out in said second readout step; and
   a step of writing data into the memory cell according to the result of comparison in said comparing step.

8. A data holding method of the nonvolatile semiconductor memory device according to claim 7, wherein the first word line potential is set to a word line potential set at the program verify time and the second word line potential is set to a word line potential lower than the word line potential set at the program verify time and not lower than a word line potential set at the read time.

9. A data holding method of the nonvolatile semiconductor memory device according to claim 7, wherein the first word line potential is set to a word line potential set at the program verify time and the second word line potential is set to a word line potential set at the read time.

10. A data holding method of the nonvolatile semiconductor memory device according to claim 8, wherein the program verify is an operation for reading out programmed data after the program operation is effected and verifying whether the data is stored as desired data or not.

11. A data holding method of the nonvolatile semiconductor memory device according to claim 9, wherein the program verify is an operation for reading out programmed data after the program operation is effected and verifying whether the data is stored as desired data or not.

12. A data holding method of the nonvolatile semiconductor memory device according to claim 7, wherein a memory cell array having said memory cells arranged in a matrix form is divided into a plurality of blocks and the data holding method is effected for a first block among said plurality of blocks while a data erase operation is effected for a second block among said plurality of blocks.

13. A data readout method of a nonvolatile semiconductor memory device having a data holding method for holding data stored in nonvolatile memory cells, comprising the steps of:

starting the data readout method;

determining whether or not a preset period of time has elapsed after the operation of the data readout method is started;

starting the data holding method when it is determined by said determining step that the preset period of time has elapsed; and restoring the data readout method after execution of the data holding method is terminated.

14. A data readout method of the nonvolatile semiconductor memory device according to claim 13, wherein the data holding method includes:

a first readout step of reading out data of the memory cell by use of a first word line potential;

a second readout step of reading out data of the memory cell by use of a second word line potential;

a comparing step of comparing data read out in said first readout step with data read out in said second readout step; and a step of writing data into the memory cell according to the result of comparison in said comparing step.

15. A data readout method of the nonvolatile semiconductor memory device according to claim 14, wherein the first word line potential is set to a word line potential set at the program verify time and the second word line potential is set to a word line potential lower than the word line potential set at the program verify time and not lower than a word line potential set at the read time.

16. A data readout method of the nonvolatile semiconductor memory device according to claim 14, wherein the first word line potential is set to a word line potential set at the program verify time and the second word line potential is set to a word line potential set at the read time.

17. A data readout method of the nonvolatile semiconductor memory device according to claim 15, wherein the program verify is an operation for reading out programmed data after the program operation is effected and verifying whether the data is stored as desired data or not.

18. A data readout method of the nonvolatile semiconductor memory device according to claim 16, wherein the program verify is an operation for reading out programmed data after the program operation is effected and verifying whether the data is stored as desired data or not.

19. A data readout method of the nonvolatile semiconductor memory device according to claim 14, wherein the preset period of time is set to a period of time during which data prior to a change can be obtained when the readout operation is effected in said second readout step in a case where charges stored in the floating gate of the memory cell are gradually extracted and data stored in the memory cell is changed.

20. A storage medium on which a data holding program for holding data stored in memory cells constructing a nonvolatile semiconductor memory device and which can be read by a computer, the data holding program comprising:

a first readout step of reading out data of the memory cell by use of a first word line potential;

a second readout step of reading out data of the memory cell by use of a second word line potential;

a comparing step of comparing data read out in said first readout step with data read out in said second readout step; and a step of writing data into the memory cell according to the result of comparison in said comparing step.

21. A storage medium which can be read by a computer according to claim 20, wherein the first word line potential is set to a word line potential set at the program verify time and the second word line potential is set to a word line potential lower than the word line potential set at the program verify time and not lower than a word line potential set at the read time.

22. A storage medium which can be read by a computer according to claim 20, wherein the first word line potential is set to a word line potential set at the program verify time and the second word line potential is set to a word line potential set at the read time.

* * * * *